United States Patent [19]
Mizushima et al.
[11] 3,781,806
[45] Dec. 25, 1973

[54] SEMICONDUCTOR SWITCHING ELEMENT AND A SEMICONDUCTOR SWITCHING INVOLVING THE SAME

[75] Inventors: Yoshihiko Mizushima; Isoneta Sudo, both of Tokyo, Japan

[73] Assignee: Nippon Telegraph and Telephone Public Corporation, Tokyo, Japan

[22] Filed: Jan. 24, 1972

[21] Appl. No.: 220,534

Related U.S. Application Data

[62] Division of Ser. No. 885,388, Dec. 15, 1969, Pat. No. 3,657,616.

[52] U.S. Cl. .............. 340/166 R, 307/304, 307/311
[51] Int. Cl. .... H01j 39/12, H01l 11/14, H04q 9/00
[58] Field of Search .................. 340/166 R, 166 FE; 307/279, 304, 311

[56] References Cited

UNITED STATES PATENTS

| | | | |
|---|---|---|---|
| 3,621,292 | 11/1971 | Vogel et al. | 307/311 X |
| 3,609,479 | 9/1971 | Lin et al. | 307/304 X |
| 3,594,728 | 7/1971 | Lytollis et al. | 307/311 X |
| 3,535,526 | 10/1970 | Henry et al. | 307/311 X |
| 3,528,168 | 9/1970 | Adamic Jr. | 307/304 X |
| 3,436,621 | 4/1969 | Crawford | 307/304 X |
| 3,435,138 | 3/1969 | Borkan | 307/304 X |
| 3,366,802 | 1/1968 | Hilibiber | 307/304 X |
| 2,913,704 | 11/1959 | Huang | 340/166 R |

*Primary Examiner*—Donald J. Yusko
*Attorney*—Leonard Holtz

[57] ABSTRACT

A semiconductor switching element and a semiconductor switching device involving the same which comprise at least one collector region diffused in a semiconductor substrate from its surface, containing a high concentration of impurities having the same type of conductivity as said substrate and displaying a higher degree of said conductivity than said substrate and formed into a fully narrow area, a base region diffused at a space of approximately 50 microns max. from said collector region, as measured from the same surface of said semiconductor substrate as that on which there is formed said collector region, in a manner to make the edge of said base region facing said collector region sufficiently longer than that of said collector region and containing a high concentration of impurities having the same type of conductivity as said semiconductor substrate and displaying a higher degree of said conductivity than said semiconductor substrate and at least one emitter region diffused from the same surface of said semiconductor substrate as that through which the aforesaid two regions are diffused and having an opposite type of conductivity to said semiconductor substrate.

13 Claims, 21 Drawing Figures

SEMICONDUCTOR SWITCHING ELEMENT AND A SEMICONDUCTOR SWITCHING INVOLVING THE SAME

This is a Division of application Ser. No. 885,388, filed Dec. 15, 1969, now U.S. Pat. No. 3,657,616, issued on Apr. 18, 1972.

The present invention relates to a semiconductor switching element and a semiconductor switching device involving the same and more particularly to such element and device well adapted to be formed into an integrated circuit.

A semiconductor switching device adapted to be formed into a integrated circuit is generally required to have its P-N junction to be prepared to a planar form. A semiconductor switching device heretofore proposed as suitable for this purpose includes the so-called planar type.

The prior art planar type semiconductor switching device is indeed so constructed that its P-N junction has a planar position, but a passage of current acting across said P-N junction is not generally lateral, but is substantially vertical. Therefore such device is not deemed essentially adapted to be formed into an integrated circuit. Further, there may be cited a double-base diode as a typical example of conventional semiconductor switching elements which well resemble a semiconductor switching element according to the present invention, as apparent from the following description. However, even said dobule-base diode has a relatively low negative resistance and relatively slow operating speed and moreover does not display a fully large ON-OFF ratio at the moment operation starts, so that it has been demanded to be improved in such respects.

The present invention has been accomplished in view of the aforesaid circumstances and is intended to provide a semiconductor switching element and a semiconductor switching device involving the same most adapted to be formed into an integrated circuit which is more improved than the prior art element involving, for example, a double-base diode in respect of various properties including negative resistance, operating speed and the ON-OFF ratio of a semiconductor element at the moment it begins to work.

In an aspect of the present invention, there is provided a semiconductor switching element comprising a semiconductor substrate, at least one collector region diffused in said substrate from its prescribed surface, containing a high concentration of impurities having the same type of conductivity as said substrate and displaying a higher degree of said conductivity than said substrate and so formed as to have a substantially small effective area, a base region diffused in said substrate in a manner to make the edge of said base region facing that of said collector region substantially longer than the latter and containing a high concentration of impurities having the same type of conductivity as said substrate and displaying a higher degree of said conductivity than said substrate, at least one emitter region diffused in said substrate between said base and collector regions having an opposite type of conductivity to said substrate, an insulation film so deposited as to cover those end portions of the junction defined by the boundaries between said substrate and each of said collector, base and emitter regions which are exposed to the surface of said substrate, and collector, base and emitter electrodes mounted on said collector, base and emitter regions respectively through said insulation film, wherein said collector resion has an effective area of approximately (20 microns)$^2$ max. and is spaced from said base region at an interval of approximately 50 microns max., and the edge of the base region facing that of the collector region is made at least more than ten times longer than that of said collector region and a semiconductor switching device involving said element.

This invention can be more fully understood from the following detailed description when taken in connection with reference to the accompanying drawings, in which.

Figures 1, 2, 3, 4, 5:
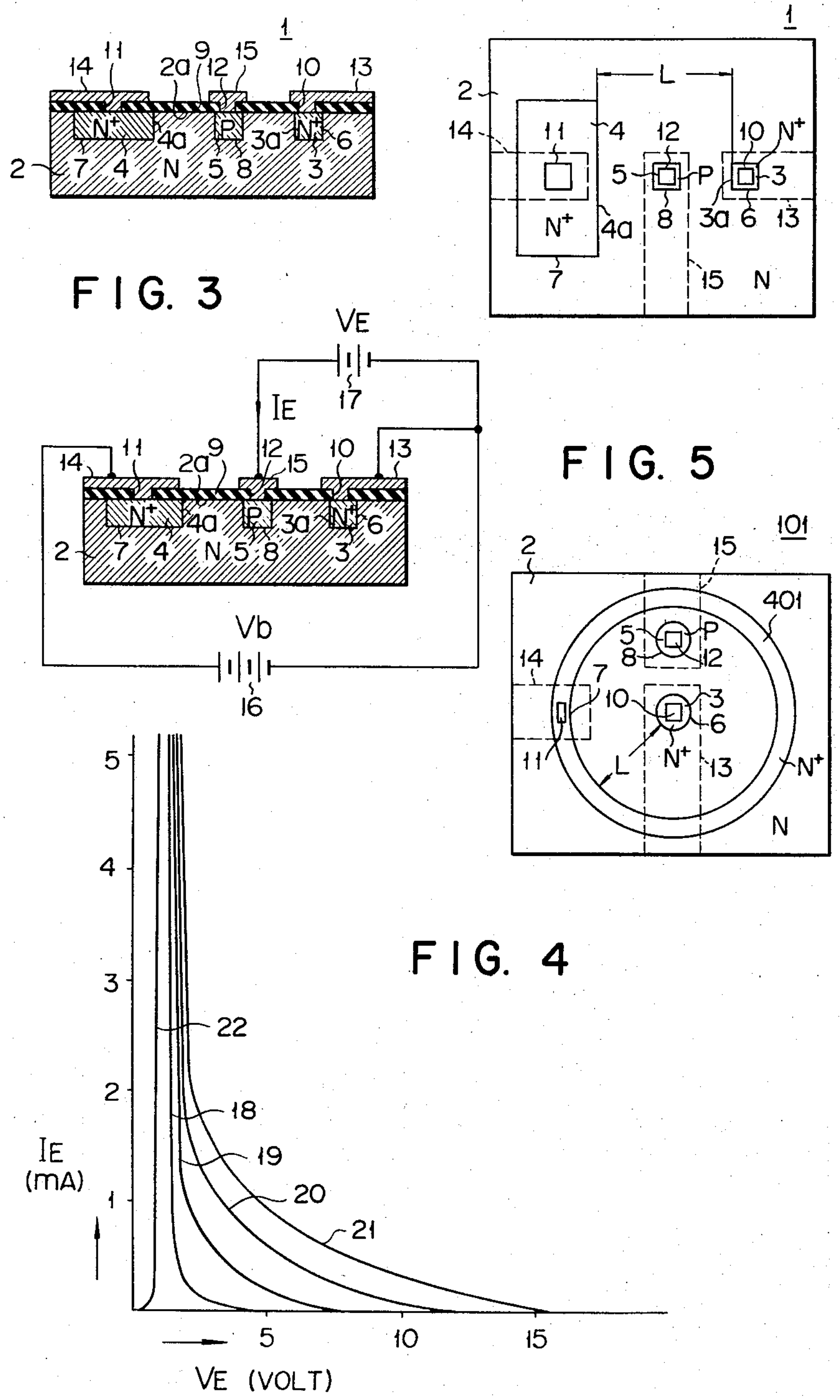
FIG. 1 is a sectional view of a semiconductor switching element prepared according to an embodiment of the present invention.
FIG. 2 is a plan view of the same.
FIG. 3 illustrates the operating principle of the semiconductor switching element of the invention shown in FIGS. 1 and 2.
FIG. 4 is a curve of the voltage $V_E$-current $I_E$ characteristics of the emitter region of said semiconductor switching element as measured by the circuit of FIG. 3.
Figure 6:
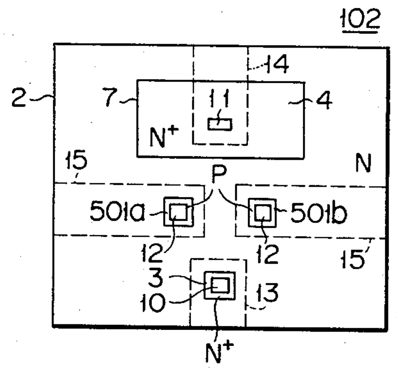
Figure 7:
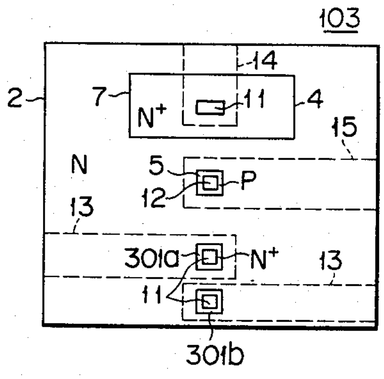
Figure 8:
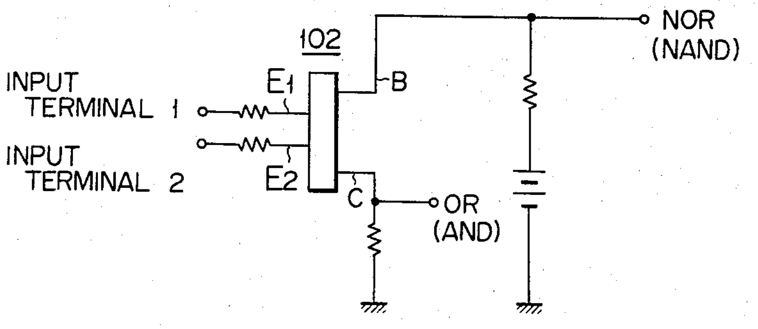
Figure 9:
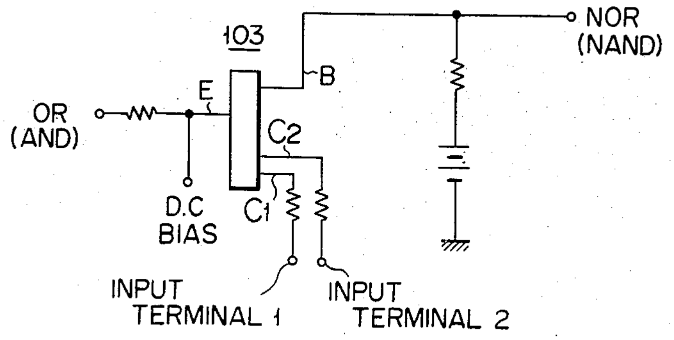

FIGS. 5 to 7 respectively show semiconductor switching elements according to other embodiments of the present invention;

FIG. 8 is a schematic logic circuit according to the invention using a semiconductor switching element of multiemitter construction shown in FIG. 6;

FIG. 9 is another form of logic circuit according to the invention using a semiconductor switching element of multi-collector construction shown in FIG. 7; and FIGS. 10 to 21 respectively represent schematic circuit arrangements of semiconductor switching devices involving a semiconductor switching element prepared according to the invention.

There will now be described by reference to the drawings a semiconductor switching element according to the present invention and a semiconductor switching device involving the same.

FIGS. 1 and 2 are schematic sectional and plan views respectively of a semiconductor switching element prepared according to an embodiment of the present invention, designating the entire element by general numeral 1. This element 1 is prepared in the following manner. There are diffused in the main surface 2*a* of an N-type silicon semiconductor substrate having a resistivity of more than 5 Ωcm, for example, 10 Ωcm a collector region 3 and base region 4, each of which has the same type of conductivity as said substrate 2, displays a higher degree of said conductivity than said substrate and contains a high concentration of $N^+$ type impurites having a resistance of 3 to 10 Ω, for example, 5 Ω per centimeter, in such a manner as to satisfy the later described relationship. As a result, there are formed $N^+$—N junctions 6 and 7 on the boundary between the substrate 2 and each of the collector and base regions 3 and 4. In that part of the main surface 2a of the substrate 2 which is defined by the interspace between the collector and base regions 3 and 4 is diffused a P-type emitter region 5 having an opposite type of conductivity to the substrate 2 in such a manner as to satisfy the undermentioned relationship, forming a P-N junction 8 on the boundary between the substrate 2 and emitter region 5. Where the collector region 3 is to be so formed as to have an effective area of (20 microns)$^2$ max. as apparent from the following description, or to assume, for example, a substantially square shape as shown, then it is preferred that the collector region be so diffused as to allow each of its four sides to have a length of 20 microns max. And the edge 4a of the base region 4 facing the collector region 3 has a length equal to substantially 10 times min. the opposite edge 3a of the collector region 3. Accordingly, where the base region is to be so formed as to assume a substantially square shape like the collector region, then it is desired that the base region be so diffused as to allow its effective area to be as large as approximately 100 times min. that of the collector region. Further, it is desired that an interspace L between the mutually facing edges 3a and 4a of the collector and base regions 3 and 4 be so chosen as to be approximately 50 microns max. in width. It is also preferred that the emitter region 5 be diffused near the base region 4 or about halfway between the collector and base regions 3 and 4. On the main surface 2a of the substrate 2 is deposited a protective insulation film 9 consisting of a layer of silicon oxide ($SiO_2$) or silicon nitride ($Si_3N_4$) or a combination thereof in such a manner as to cover at least the ends of those parts of the junctions 6, 7 and 8 which are exposed to the main surface 2a. The parts of the protective insulation film 9 facing the collector, base and emitter regions 3, 4 and 5 are perforated by etching with openings 10, 11 and 12 respectively. Through these openings are fitted, for example, by vapour deposition collector, base and emitter electrodes made of conductive metal such as aluminium respectively.

FIG. 3 illustrates the principle of operation of a semiconductor switching element 1 prepared in the aforementioned manner according to the present invention. Between the collector and base electrodes 13 and 14 is connected a first D.C. source 16 for setting a drift field used in so controlling minority carriers (or holes in this embodiment) as to allow them to be shifted through the body 1 of the subject semiconductor switching element from the emitter region 5 to the collector region 3. Also between the collector and emitter electrodes 13 and 15 is connected a second D.C. source 17 having a polarity acting in the forward direction as indicated.

With the voltages of the first and second D.C. sources 16 and 17 designated by $V_B$ (volts) and $V_E$ (volts) respectively, the current flowing through the emitter electrode by $I_E$ (mA), the voltage $V_B$ of the first D.C. source 16 used as a parameter, the voltage $V_E$ represented by an abscissa and the current $I_E$ by an ordinate, then the aforementioned connection will enable the semiconductor element 1 to display the $V_E$–$I_E$ characteristics shown in FIG. 4.

Where the voltage $V_B$ providing said drift field is set at 5 volts, the voltage $V_E$ falls as indicated by the curve 18, in the range below approximately 4 volts. If, under such conditions, the current $I_E$ is slowly increased, the voltage $V_E$ will decrease non-linearly, presenting negative resistance properties, so that there appears a saturated current when the voltage $V_E$ approaches approximately 2 volts. Also when the aforesaid voltage $V_B$ stands at 10 volts, the voltage $V_E$ falls as shown by the curve 19, in the range below approximately 8 volts. If, under such conditions, the current $I_E$ is slowly increased, the voltage $V_E$ will decrease non-linearly due to the negative resistance properties and when the voltage $V_E$ approaches about 3 volts there flows a saturated current. When the voltage $V_B$ rises to 15 volts, the voltage $V_E$ amounts to less then about 12 volts as illustrated by the curve 20. If, at this time, the $I_E$ is slowly raised, the voltage $V_E$ will be reduced non-linearly due to the negative resistance properties, and when the voltage is drawn near about 3.5 volts there arises a saturated current. Further where the voltage $V_B$ is as high as 20 volts, the voltage $V_E$ indicates about 16 volts max. as represented by the curve 21. If the current $I_E$ is gradually elevated the voltage $V_E$ falls non-linearly due to the negative resistance properties and when the voltage $V_E$ comes near about 4 volts there occurs a saturated current.

As apparent from the foregoing description and FIG. 4, there is the tendency that the lower the voltage $V_B$, the sharper rise will be presented by the $V_E$–$I_E$ characteristics and the higher the voltage $V_B$, the slower rise will be indicated by said $V_E$–$I_E$ characteristics, until the saturated level of current is reached.

The appearance of the aforesaid $V_E$–$I_E$ characteristics is supposed to be for the following reason. The voltage $V_B$ of the first D.C. source 16 connected between the collector and base electrodes 13 and 14 generates a drift field in the semiconductor switching element 1. The voltage $V_E$ of the second D.C. source 17 connected in the forward direction between the collector and emitter electrodes 13 and 15 introduces minority carriers (or holes in this embodiment) into the semiconductor switching element 1. Accordingly, where the voltage $V_E$ has a relatively low value with respect to the voltage $V_B$, the emitter junction 8 is biased in the reverse direction, preventing the introduction of said minority carriers. However, where the voltage $V_E$ increases over the aforesaid level, or where it reaches a certain level, namely, a turnover voltage, then the emitter junction 8 is biased in the forward direction. At this moment the minority carriers begin to be introduced, allowing holes to be shifted from the P-type emitter region 5 to the $N^+$—type collector region 3. Said shifting of holes is directed to the $N^+$—type collector region 3 instead of to the ohmic contact area as is observed in the prior art double-base diode, so that there results an extremely sharp modulation of conductivity, allowing a switching operation to be conducted at a very high speed. The value of the voltage $V_E$ at that time approximately corresponds to a turnover point on the curve of $V_E$-$I_E$ characteristics shown in FIG. 4.

If, in this case, the voltage $V_B$ stands at zero, there is not created a drift field for shifting the aforesaid minority carriers through the body 1 of the switching element, preventing it from displaying the negative resistance properties. Where the voltage $V_E$ is zero as shown by the curve 22 of FIG. 4 the current $I_E$ is also zero. As said voltage $V_E$ increases, the current $I_E$ sharply rises. When the voltage approaches 0.7 volts there appears a saturated current. On the other hand where the first D.C. source 16 disposed between the collector and base electrodes 13 and 14 and the second source 17 positioned between the collector and emitter electrodes 13 and 15 or either of these sources is impressed with a voltage having an opposite polarity to the preceding case, it is obvious that there are not introduced said minority carriers and there flows substantially no emitter current.

As apparent from the foregoing description and the curves of $V_E$-$I_E$ characteristics shown in FIG. 4, the semiconductor switching element of the present invention displays a far sharper modulation of conductivity than is possible with, for example, the prior art double-base diode. This effect is presumed to be for the following reason. The minority carriers injected from the emitter junction cause the modulation of conductivity while being shifted to the collector region. At this time said minority carriers are accumulated in the proximity of the N—$N^+$ junction of the collector region and equivalently reduced in the drift speed in said proximity, with the result that there are drawn out of the collector electrode 13 a larger number of majority carriers than said minority carriers.

Accordingly, it will be apparent to those skilled in the art that the semiconductor switching element of the present invention is capable of allowing the negative resistance to be increased over that of the conventional double-base diode and also the operating speed to be elevated, and moreover the ON-OFF ratio to be prominently improved.

To further describe said ON-OFF ratio by reference to the curve of $V_E$-$I_E$ characteristics of FIG. 4, the sustaining voltage $V_S$ which prevails when the current $I_E$ flows, namely, when the semiconductor switching element 1 is in an ON state, can be more reduced than in the case of the prior art double-base diode. Accordingly, the ratio of the resistance occurring when there does not flow the current $I_E$, namely, when said element 1 is turned off, to the resistance appearing when there flows the current $I_E$, namely, when said element 1 is turned on, is prominently increased.

At this point, particular attention is called to the fact that with the semiconductor switching element of the present invention, there is formed a collector region 3 with a sufficiently small effective area to allow its edge 3a facing that 4a of a base region 4 to be far shorter than the latter and there is fully utilized the effect of allowing the aforesaid minority carriers to be accumulated in large numbers around the outer periphery of said collector region 3 and in this respect, therefore, the present semiconductor switching element has an entirely novel arrangement of semiconductor junctions decidedly different from that of any known semiconductor element and consequently exhibits unique operating properties.

It will be apparent, therefore, that prominently to display the aforementioned effect of accumulating minority carriers, the collector region 3 should preferably be so formed as to have as small a diffused area as possible or an effective area of, for example, about (20 microns)$^2$ as described above.

Obviously, the interspace between the collector and base regions 3 and 4 is most preferred to be as narrow as possible, for example, 50 microns max. and the edge *4a* of the base region 4 facing that *3a* of the collector region 3 is desired to be as long as possible, for example, more than about 10 times longer than the latter. It is further desired that the emitter region 5 be located about halfway between the collector and base regions 3 and 4 or rather near the base region 4. These facts have also been confirmed by the inventors' experiments.

FIG. 5 shows a semiconductor switching element according to another embodiment of the present invention. In this embodiment, the base region 401 is prepared in a substantially annular form around the outer periphery of an area including the collector and emitter regions 3 and 5 in such a manner that the interspace L between the outer periphery of the collector region 3 and the inner periphery of said base region 401 assumes a concentric form about said collector region 3 so as to have a width of about 50 microns max. (The base region 401 may take any other desired form, for example, a rectangle, or triangle.) A semiconductor switching element 101 thus prepared will obviously display substantially the same effect as that 1 of the preceding embodiment. When the base region 401 is so formed as to contact the entire outer periphery of a zone including the collector and emitter regions (it is not always necessary to specify said entire outer periphery, but use of any substantially equivalent area will be sufficient), then there will be obtained the effect of prominently reducing mutual interference between a plurality of similar switching elements 101 when they are disposed close to each other.

FIG. 6 indicates a semiconductor switching element 102 according to still another embodiment of the invention, which has the so-called multi-emitter construction obtained by splitting an emitter region into two divisions 501a and 501b.

FIG. 7 shows a semiconductor switching element 103 according to a further embodiment of the invention, which has the so-called multi-collector construction obtained by splitting a collector region into two divisions *301a* and *301b*. Use of a semiconductor switching element 102 or 103 having a multi-emitter or multi-collector construction shown in FIG. 6 or 7 will obviously permit the formation of an AND or OR circuit shown, for example in FIG. 8 or 9 from a single unit of such element. If, in FIG. 8, there is drawn out an output from the collector terminal C of the switching element 102 having a multi-emitter construction, then there will result an OR circuit. On the other hand, if there is drawn out an output from the base terminal B of said element 102, then there will be formed a NOR circuit. It will be apparent to those skilled in the art that if the levels of input signals supplied to the emitter terminals $E_1$ and $E_2$ or the relative diffused positions of the collector, base and emitter regions are suitably controlled, then the circuit of FIG. 8 can be used as an AND or NAND circuit in place of the OR or NOR circuit respectively.

The circuit of FIG. 9 is only different from that of FIG. 8 in that there are provided input terminals in the multi-collector regions instead of in the multi-emitter regions, so that the circuit of FIG. 9 can be used as an OR or NOR circuit or, as required, AND or NAND circuit. It will be noted here that a semiconductor switching element having a multi-emitter and a multi-collector construction prepared according to the present invention has the advantage of eliminating the necessity of providing isolation between the split divisions of given regions as is practised, for example, in the prior art multi-emitter transistor.

Figure 10:
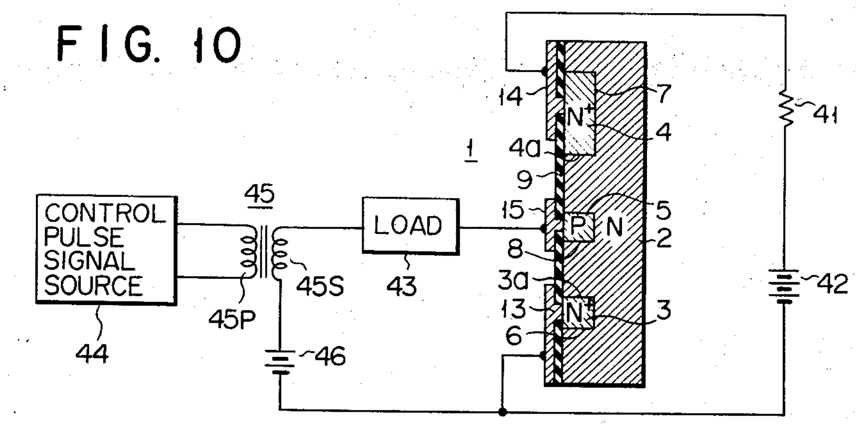

FIG. 10 is a schematic representation of a semiconductor switching device prepared from the semiconductor switching element 1 described by reference to FIGS. 1 and 2 according to an embodiment of the present invention. There is connected between the collector and emitter electrodes 13 and 15 of the semiconductor switching element 1 through a resistor 41 a first D.C. source 42 for creating a drift field in the body of said element 1 as described above. Also between the collector and emitter electrodes 13 and 15 is connected a second D.C. source through a load 43 to be switched by said element 1 which is arranged in series with the secondary winding coil 45*s* of a pulse transformer 45 comprising said coil 45*s* and a primary winding coil 45*p* impressed with the later described control pulse signal from a control pulse signal source 44. In a semiconductor switching device of the aforesaid arrangement, the first and second D.C. sources 42 and 46 correspond to those 16 and 17 of FIG. 3. The voltages of the first and second D.C. sources 42 and 46 and the value of the resistor 41 are previously set at adequate levels. There is previously made such arrangement that unless there is supplied a prescribed control pulse signal from the control pulse signal source 44, there will not flow any current across the collector and emitter electrodes 13 and 15. Under such condition, there can be introduced current across said electrodes 13 and 15 only when there are supplied through the pulse transformer 45 control pulse signals having a prescribed voltage of positive polarity from the control pulse signal source 44. As a result, the load 43 is switched on to ON state. When, at this point, there are supplied pulse signals having a prescribed voltage of negative polarity from the control pulse signal source 44, then the current running across the collector and emitter electrodes 13 and 15 is stopped to switch off the load 43 to OFF state.

Figure 11:
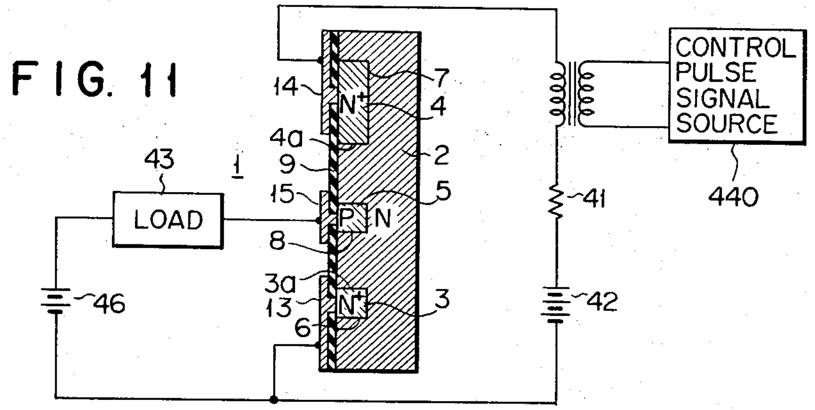

FIG. 11 schematically illustrates the arrangement of a semiconductor switching device prepared from the semiconductor switching element 1 shown in FIGS. 1 and 2 according to another embodiment of the present invention. This embodiment has the same arrangement as that of FIG. 10 excepting that the control pulse signal source 44 is connected between the collector and base electrodes 13 and 14 instead of between the collector and emitter electrodes 13 and 15 as in FIG. 10, and detailed description thereof is omitted. The semiconductor switching device of FIG. 11 is only different from that of FIG. 10 in that the control pulse signal from the control pulse signal source 44 has an opposite polarity to the case of FIG. 10 and is capable of controlling the switching of a load 43 in exactly the same manner as in FIG. 10.

Figure 12:
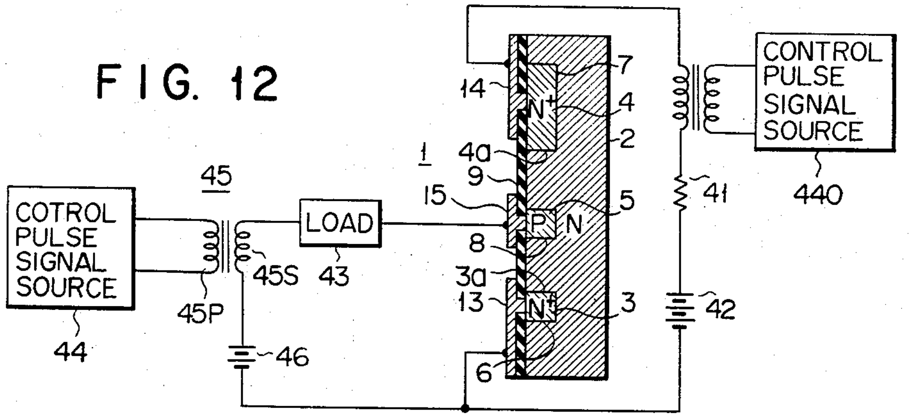

FIG. 12 represents the arrangement of a semiconductor switching device prepared from the semiconductor switching element 1 shown in FIGS. 1 and 2 according to still another embodiment of the present invention. In this embodiment, there are provided two control pulse signal sources 44 and 440. One source 44 is connected between the collector and emitter electrodes 13 and 15 as in FIG. 10 and the other 440 is connected between the collector and base electrodes 13 and 14 as in FIG. 11.

With a semiconductor switching device of the aforementioned arrangement, when there is supplied a positive control pulse signal having a prescribed voltage from the control pulse signal source 44 and a negative control pulse having a prescribed voltage from the control pulse signal source 440 or either of them, then there is introduced current into the load 43 to switch it on to ON state. If, under such condition, there is reversely supplied a negative control pulse signal having a prescribed voltage from the control pulse signal source 44 and a positive control pulse signal having a prescribed voltage from the control pulse signal source 440 or either of them, then the current running through the load 43 up to this point is stopped to turn it off to OFF state.

Figure 13:
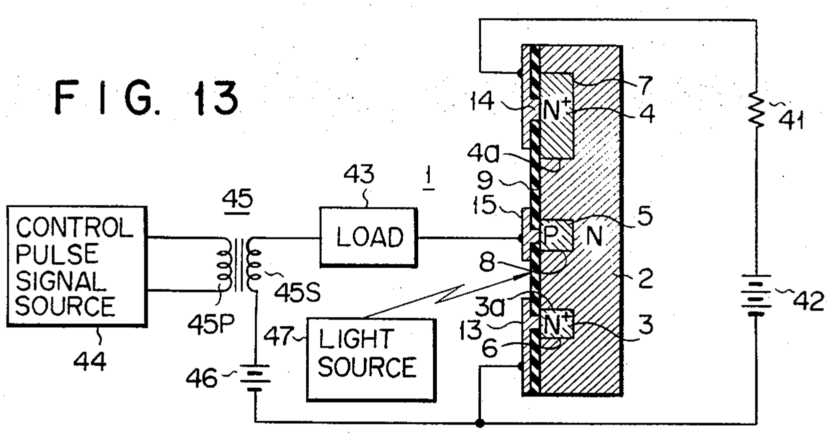
Figure 14:
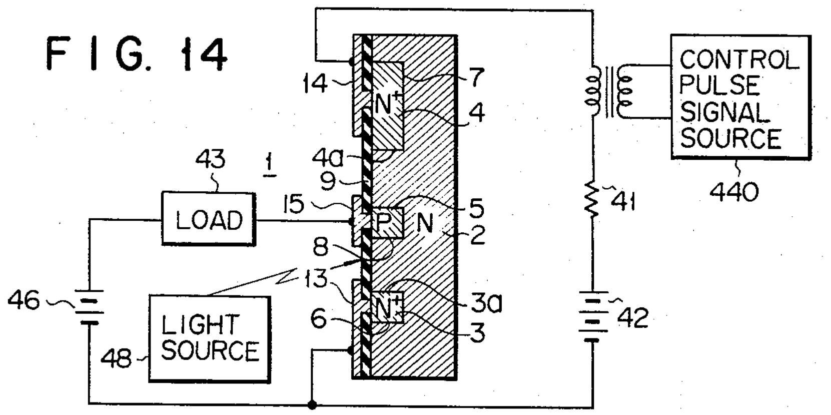
Figure 15:
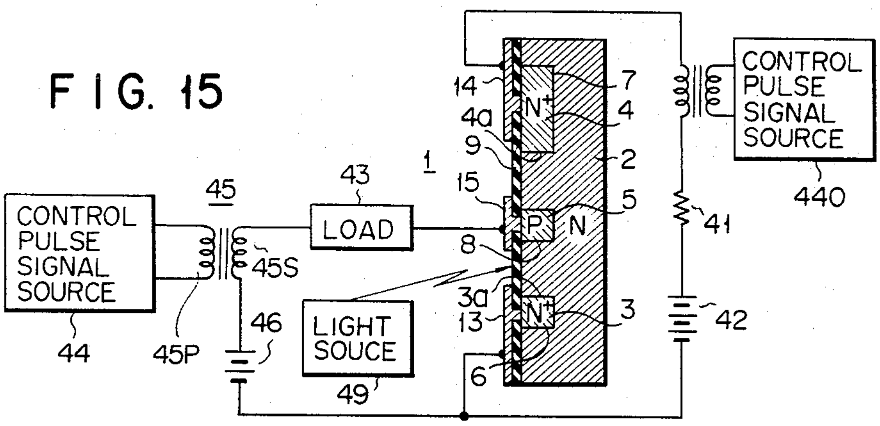

FIGS. 13, 14 and 15 show semiconductor switching devices according to further embodiments of the present invention prepared in a manner to correspond to those of FIGS. 10, 11 and 12 respectively. Between the collector and emitter regions 3 and 5 of each of the semiconductor switching devices of FIGS. 13, 14 and 15 there are disposed light sources 47, 48 and 49 respectively. Projection of light to the interspace between the collector and emitter regions 3 and 5 from said light source enables minority carriers to be shifted from the emitter region 5 to the collector region 3. Accordingly, there flows current across the collector and emitter electrodes 13 and 15, namely, through the load 43 to turn it on to ON state. If, under such condition, there is sent forth a negative control pulse signal from the control pulse signal source 44 of FIG. 13, a positive control pulse signal from the control pulse signal source 440 of FIG. 14 and a negative and/or positive control pulse signal from the control pulse signal source 44 and/or 440 of FIG. 15, all with a prescribed voltage, then the load 43 will be brought to OFF state.

All the semiconductor switching devices of FIGS. 10 to 15 involve a common collector type connection circuit system. However, such system may obviously be replaced by a common base or common emitter connection circuit system as is used in a prior art transistor.

Figure 16:
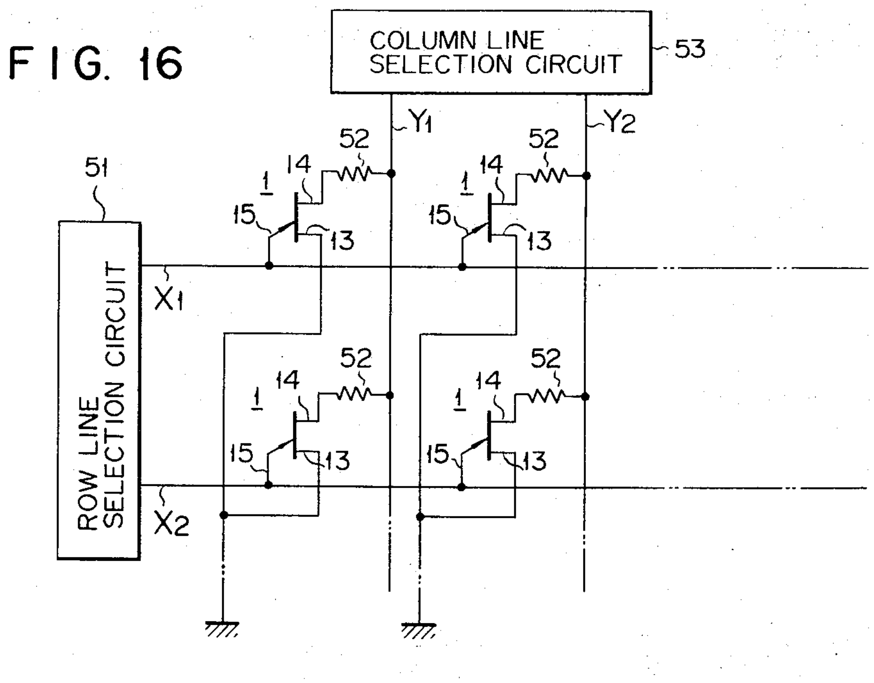

FIG. 16 shows the arrangement of a semiconductor switching device according to a further embodiment of the present invention formed into an integrated circuit, where the semiconductor switching element 1 of FIGS. 1 and 2 is used as a memory element disposed in each address arranged in the form of a matrix.

On a common semiconductor substrate (not shown), there is disposed a semiconductor element 1 in each of the memory addresses arranged in the form of a matrix, corresponding to a prescribed memory capacity. The collector electrodes 13 of said semiconductor elements 1 are jointly connected to each column line for grounding. The emitter electrodes 15 of said semiconductor elements 1 are jointly connected to each of a plurality of row lines $X_1$, $X_2$, . . . arranged on the aforesaid common semiconductor substrate in a state insulated from each other. These row lines $X_1$, $X_2$, . . . are selectively operated as described later by a circuit 51 for selectively operating the row lines.

The base electrodes 14 of the semiconductor elements 1 are jointly connected to each of a plurality of column lines $Y_1$, $Y_2$, . . . through the corresponding resistors 52. These column lines $Y_1$, $Y_2$ , . . . are selectively operated by a circuit 53 for selectively operating the column lines.

With a semiconductor switching device of the aforesaid arrangement, when the connected electrodes of the memory elements 1 are supplied at the same time with pulse signals or D.C. signals having prescribed voltages acting in the forward direction by said circuits 51 and 53 for selectively operating the row and column lines, only the memory elements 1 lying at the intersection of the selectively actuated row and column lines are also selectively conducted and generate outputs corresponding to the "1" or "0" of the two-valued logic. In this case, those of the memory elements 1, which are selectively activated by only either of the row and column lines assume a semi-selected state, are not energized like the memory elements 1 located at the remaining addresses, namely, are brought to a nonconducting state. This operation system is known as the current coincidence method.

Accordingly, for example, where there is supplied at the same time by said selection circuits 51 and 53 of the row and column lines a positive pulse signal or a D.C. signal having a prescribed voltage to the first row line $X_1$ and a negative pulse signal or D.C. signal having a prescribed voltage to the first column line $Y_1$, then there flows current only across the collector and emitter electrodes 13 and 15 of a memory element 1 located at the junction of said first row line $X_1$ and first column line $Y_1$, thus selectively actuating only the load (not shown) connected to said electrodes.

Figure 17:
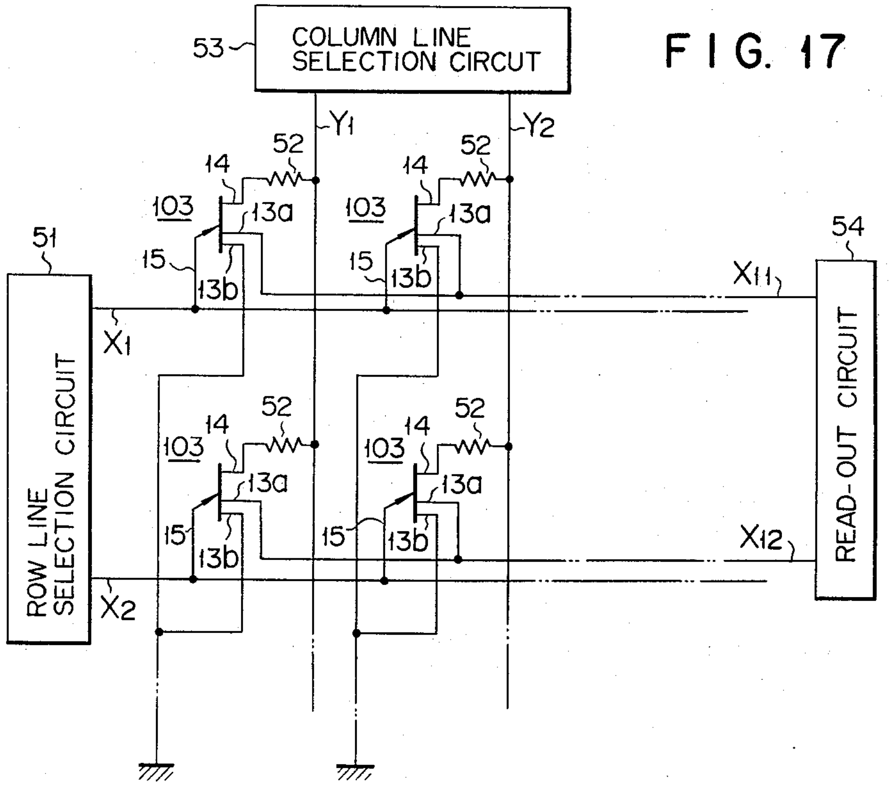

FIG. 17 shows a semiconductor switching device according to a further embodiment of the present invention formed into an integrated circuit. In this embodiment, a semiconductor switching element positioned in each memory address is the type 103 comprising multi or two collector electrodes shown in FIG. 7. The remaining one of said two collector electrodes involved in one switching element after excluding the one used as shown in FIG. 16 is connected together with such remaining collector electrodes of the other switching elements to each of a separate group of second row lines $X_{11}$, $X_{12}$, . . . similar to the first row lines $X_1$, $X_2$, . . . . Said second row lines $X_{11}$, $X_{12}$, . . . are connected to a read-out circuit 54. A semiconductor switching device of the present invention arranged as dscribed above enables outputs from those of the memory elements 103 selectively energized by the selection circuits 51 and 53 of the row and column lines to be read out by a read-out circuit 54.

Figure 18:
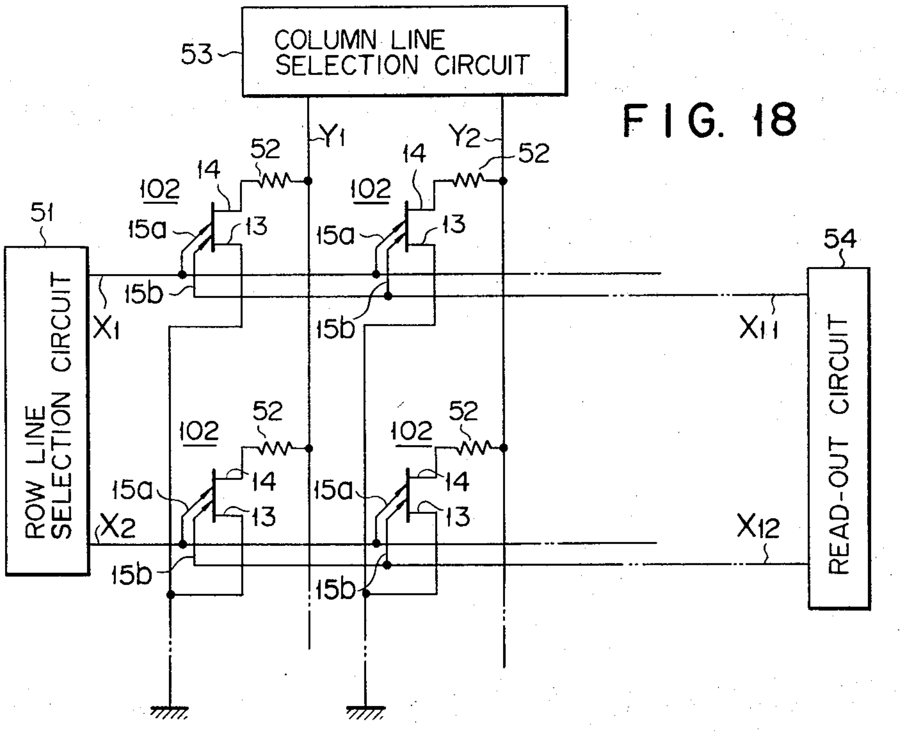
Figure 19:
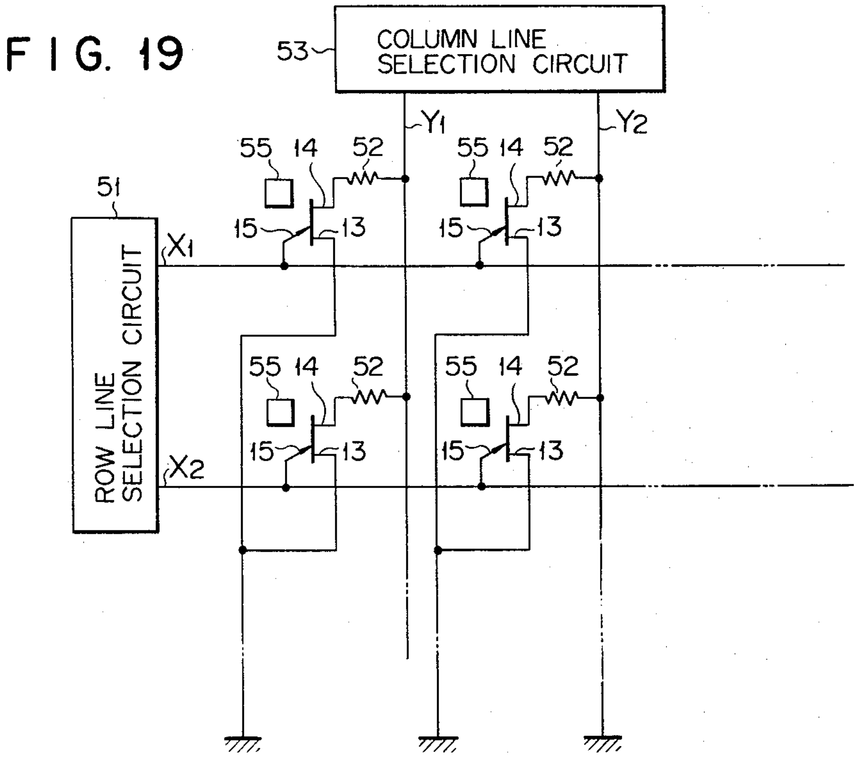
Figure 20:
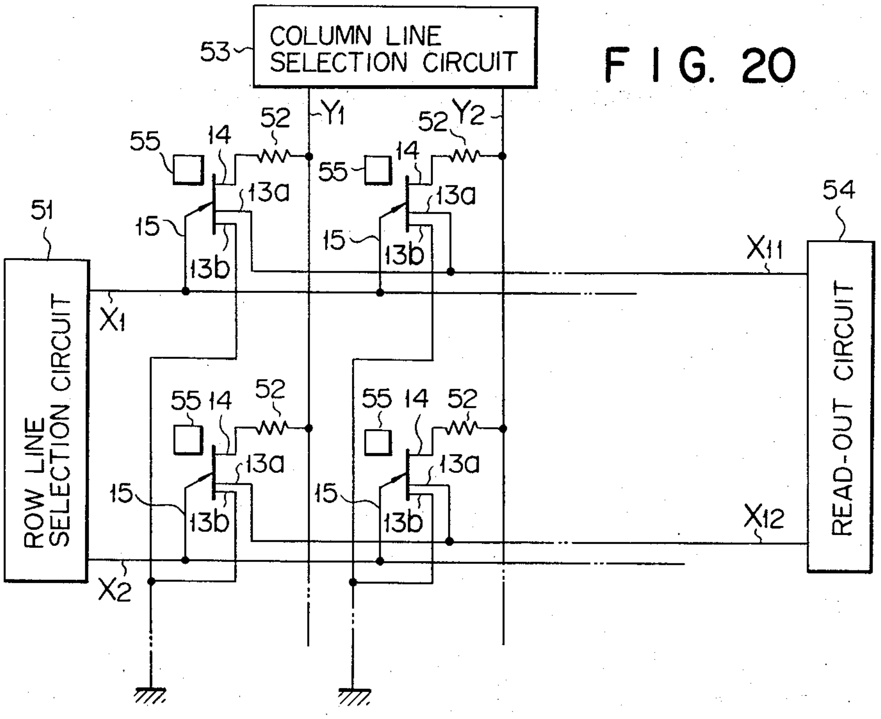
Figure 21:
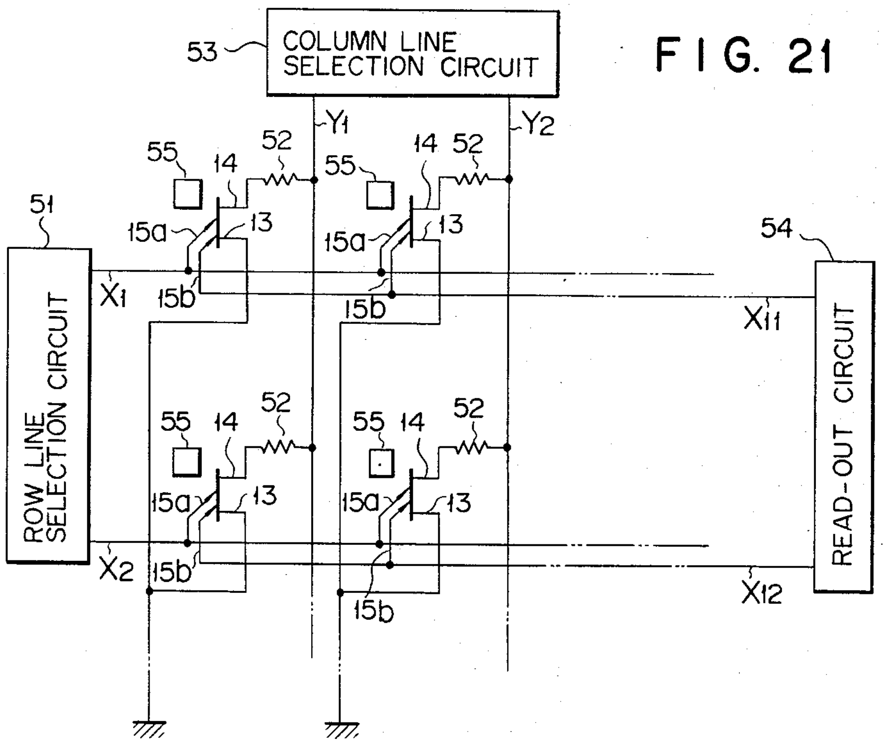

FIGS. 19, 20 and 21 represent the arrangements of semiconductor switching devices according to further embodiments of the present invention prepared in a manner to correspond to those of FIGS. 16, 17 and 18 where there is provided a light source 55 for controlling the introduction of minority carriers into the interspace between the emitter and collector regions of each of the memory elements 1, 102 and 103 involved in said switching devices. With the switching devices of FIGS. 19 to 21, there are kept in a conducting state only those of the memory elements illuminated by the light source 55, and all those of the memory elements which are impressed with a prescribed voltage of opposite polarity by said selection circuits 51 and 53 of the row and column lines, or either of them remain in a non-conducting state.

The semiconductor switching devices of FIGS. 16 to 21 involve memory elements used as common collector type connection circuits. However, said elements may also be used as common emitter or common base type circuits. In the case of FIGS. 16 and 19, the remaining two of the three common, base and collector electrodes after excluding the one used as a common unit may be connected to either of said row line selection circuit 51 or said column line selection circuit 53. Where there is used a switching element comprising multi-emitters or multi-collectors shown in FIGS. 17, 18, 20 and 21, the three remaining electrodes after excluding the one used as a common unit may be connected to any of the row line selection circuit 51, column line selection circuit 53 and read-out circuit 54. Also where the memory elements of FIGS. 16 to 21 are used in controlling the switching of an external circuit consisting of, for example, a large number of telephone lines, loads whose switching is to be controlled by said memory elements have only to be disposed in series in a passage of current between the emitter and collector electrodes 13 and 15 of each of said memory elements.

What we claim is:

1. A semiconductor switching device comprising:

a plurality of columns of conductors in contact with one surface of the semiconductor substrate;

a plurality of rows of conductors in contact with said one surface in a crossing direction of said columns to form a matrix, each cross-point having at least one semiconductor switching element coupled thereto, each switching element including a semiconductor substrate; at least one collector region diffused in said substrate from a predetermined surface of said substrate, said collector region containing a high concentration of impurities imparting thereto the same type of conductivity as said substrate and displaying a higher degree of conductivity than said substrate and being so formed as to have a substantially small effective area; a base region diffused in said substrate such that the edge of said base region facing that of said collector region is substantially longer than the latter, said base region containing a high concentration of impurities imparting thereto the same type of conductivity as said substrate and displaying a higher degree of conductivity than said substrate; at least one emitter region diffused in said substrate between said base and collector regions and having an opposite type of conductivity as said substrate; said collector region having an effective area of approximately (20 microns)$^2$ max. and being spaced from said base region at an interval of approximately 50 microns max., the edge of said base region facing that of the collector region being at least ten times longer than the latter, and the emitter region being disposed between said collector and base regions and substantially near the base region;

means for coupling a first power source across said collector and emitter electrodes of said at least one semiconductor switching element;

means for coupling a second power source across said collector and base electrodes of said at least one switching element;

a load disposed in a current path between said emitter and collector electrodes of said at least one switching element; and control means for supplying said at least one switching element with signals for controlling the state of said switching element to thereby control the switching of current to said load.

2. A semiconductor switching device according to claim 1 wherein said first and second power sources are D.C. power sources, said first D.C. power source generating a drift field in the body of said at least one switching element, said second D.C. power source generating a bias voltage acting in a forward direction in said at least one switching element, said load being coupled in series with said first D.C. source, and wherein said control means includes a control pulse signal source for selectively supplying said switching element with pulse signals for controlling the state of said switching element.

3. A semiconductor switching device according to claim 2 wherein said control means further comprises a light source for selectively projecting light to the interspace between at least the emitter and collector regions of said at least one semiconductor switching element for controlling the introduction of minority carriers into said collector region from said emitter region.

4. A semiconductor switching device according to claim 2 wherein said control pulse signal source is so connected as to supply control pulse signals to a current path between said emitter and collector electrodes of said switching element.

5. A semiconductor switching device according to claim 2 wherein said control pulse signal source is so connected as to supply control pulse signals to a current path between said base and collector electrodes of said switching element.

6. A semiconductor switching device according to claim 3 wherein said control pulse signal source is so connected as to supply control pulse signals to a current path between said emitter and collector electrodes of said switching element.

7. A semiconductor switching device according to claim 3 wherein said control pulse signal source is so connected as to supply control pulse signals to a current path between said base and collector electrodes of said switching element.

8. A semiconductor switching device according to claim 3 wherein said control pulse signal source is so connected as to supply control pulse signals to a current path between said emitter and collector regions and to a current path between said base and collector regions of said switching element respectively.

9. A semiconductor switching device according to claim 1 wherein said control pulse signal source is so connected as to supply control pulse signals to a current path between said emitter and collector regions and to a current path between said base and collector regions of said switching element, respectively.

10. A semiconductor switching device according to claim 1 comprising a plurality of said semiconductor switching elements arranged in a matrix form, one of the collector, base and emitter electrodes of each switching element being coupled together with those of other of said switching elements as a common electrode for inputs and outputs to and from said matrix, one of the remaining two electrodes of each of said switching elements being coupled to those of other of said switching elements by row conductors to form respective row lines in said matrix, and the other of said remaining two electrodes of each of said switching elements being coupled together with those of other of said switching elements by column conductors to form respective column lines, and wherein said means for coupling said first power source includes a first line selection circuit and said means for coupling said second power source includes a second line selection circuit, said line selection circuits supplying control signals for selectively controlling the states of said switching elements.

11. A semiconductor switching device according to claim 10 wherein said control means further comprises a light source for selectively projecting light to the interspace between at least the emitter and collector regions of each of the semiconductor switching elements of said matrix for controlling the introduction of minority carriers into said collector regions from said emitter region.

12. A semiconductor switching device according to claim 10 wherein one of said emitter and collector regions is split into at least two divisions, and readout means coupled to one of the divisions of each of said split regions.

13. A semiconductor switching device according to claim 1 comprising a plurality of said semiconductor switching elements arranged in a matrix form, and wherein one of said emitter and collector regions being split into at least two divisions, one of the four electrodes associated with said collector, base and emitter regions of each switching element being coupled together with those of other of said switching elements as a common electrode for inputs and outputs to and from said matrix, one of the remaining three electrodes of each of said switching elements being coupled to those of other of said switching elements by row conductors to form respective row lines in said matrix, the second of said remaining three electrodes of each of said switching elements being coupled together with those of other of said switching elements by column conductors to form respective column lines, and the third of said remaining three electrodes of each of said switching elements being coupled to those of other of said switching elements in a row or column, and said third of said remaining three electrodes being connected to a readout means, and wherein said means for coupling said first power source includes a first line selection circuit and said means for coupling said second power source includes a second line selection circuit, said line section circuits supplying control signals for selectively controlling the states of said switching elements.

* * * * *

UNITED STATES PATENT OFFICE
CERTIFICATE OF CORRECTION

Patent No. 3,781,806 Dated December 25, 1973

Inventor(s) Yoshihiko MIZUSHIMA et al

It is certified that error appears in the above-identified patent and that said Letters Patent are hereby corrected as shown below:

In the heading of the patent, add the following priority data:

-- [30] Foreign Application Priority Data

December 20, 1968 Japan................93347/68--.

Signed and sealed this 9th day of July 1974.

(SEAL)
Attest:

McCOY M.GIBSON,JR.
Attesting Officer

C. MARSHALL DANN
Commissioner of Patents